United States Patent
Okutoh et al.

(10) Patent No.: US 6,201,271 B1
(45) Date of Patent: Mar. 13, 2001

(54) SEMICONDUCTOR MEMORY DEVICE PREVENTED FROM DETERIORATION DUE TO ACTIVATED HYDROGEN

(75) Inventors: Akira Okutoh, Kobe; Yasuyuki Itoh, Yokohama, both of (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/115,244

(22) Filed: Jul. 14, 1998

(30) Foreign Application Priority Data

Jul. 29, 1997 (JP) ...................................................... 9-202789

(51) Int. Cl.[7] .......................... H01L 29/94; H01L 27/108; H01L 29/76; H01L 31/119
(52) U.S. Cl. ........................... 257/295; 257/296; 257/306
(58) Field of Search ..................................... 257/295–306; 361/302–305, 310–313; 438/3, 240

(56) References Cited

U.S. PATENT DOCUMENTS

| | | |
|---|---|---|
| 5,003,428 | 3/1991 | Shepard . |
| 5,005,102 | 4/1991 | Larson . |
| 5,053,917 | 10/1991 | Miyasaka et al. . |
| 5,142,437 | 8/1992 | Kammerdiner et al. . |
| 5,185,689 | 2/1993 | Maniar . |
| 5,335,138 | 8/1994 | Sandhu et al. . |
| 5,407,855 | 4/1995 | Maniar et al . |
| 5,555,486 | 9/1996 | Kingon et al. . |
| 5,566,045 | * 10/1996 | Summerfelt et al. ................. 361/305 |
| 5,567,964 | 10/1996 | Kashihara et al. . |
| 5,622,893 | 4/1997 | Summerfelt et al. . |
| 5,701,647 | 12/1997 | Saenger et al. . |
| 5,714,402 | 2/1998 | Choi . |
| 5,717,236 | 2/1998 | Shinkawata . |
| 5,790,366 | * 8/1998 | Desu et al. ........................... 257/295 |
| 5,994,153 | * 10/1999 | Nagel et al. .............................. 438/3 |
| 6,015,987 | * 1/2000 | Arita et al. ........................... 257/303 |

FOREIGN PATENT DOCUMENTS

| | | |
|---|---|---|
| 5-343251 | 12/1993 | (JP) . |
| 6-326249 | 11/1994 | (JP) . |
| 7-94680 | 4/1995 | (JP) . |
| 7-99290 | 4/1995 | (JP) . |
| 8-51165 | 2/1996 | (JP) . |
| 8-274270 | 10/1996 | (JP) . |
| 9-45872 | 2/1997 | (JP) . |
| 9-162372 | 6/1997 | (JP) . |

* cited by examiner

*Primary Examiner*—Tom Thomas
*Assistant Examiner*—Cuong Quang Nguyen
(74) *Attorney, Agent, or Firm*—Nixon & Vanderhye P.C.

(57) ABSTRACT

An alloy oxide film of platinum and rhodium is formed as an upper electrode so as to be put in direct contact with a ferroelectric PZT film. Asymmetry of a hysteresis loop characteristic of a dielectric material representing a correlation between a polarization value and an application electric field as well as a deterioration such as an increase in leak current density, when oxide electrode of $IrO_2$, $RuO_2$, $RhO_2$ or the like is used, are improved.

3 Claims, 6 Drawing Sheets

SEMICONDUCTOR MEMORY DEVICE PREVENTED FROM DETERIORATION DUE TO ACTIVATED HYDROGEN

BACKGROUND OF THE INVENTION

The present invention relates to a semiconductor memory device employing a capacitor insulating film provided by a ferroelectric thin film or a highly dielectric thin film.

The conventional nonvolatile memories of EPROM (Erasable Programable Read Only Memory), EEPROM (Electrically Erasable Programmable Read Only Memory), flash memory and so on have the same read time as that of DRAM (Dynamic Random Access Memory); however, they have a long write time, for which no high-speed operation can be expected. In contrast to this, the ferroelectric memory that is a nonvolatile memory employing a ferroelectric capacitor and has the same read and write performances as those of DRAM is the nonvolatile memory with which a high-speed operation can be expected.

In regard to the device structure of this ferroelectric memory, one ferroelectric capacitor and one select transistor constitute one cell.

As an electrode material of the ferroelectric capacitor, platinum has widely been used for both the upper electrode and the lower electrode for such a reason that it has a resistivity to a high-temperature oxidative atmosphere for crystallizing the ferroelectric material. As a ferroelectric material to be used for the ferroelectric capacitor, attention is focused on $SrBi_2Ta_2O_9$ (SBT) and $Bi_4Ti_3O_{12}$ (BIT) that have excellent fatigue properties and are able to be operated at low voltage as compared with $PbZr_xTi_{1-x}O_3$ (PZT) having been examined to the detail, and the former substances are under elaborate examination.

As a method for forming the above ferroelectric thin film, there are a MOD (Metal Organic Deposition) method, a sol-gel method, a MOCVD (Metal Organic Chemical Vapor Deposition) method, a sputtering method and so on. According to any one of the film forming methods, the oxide ferroelectric film must be crystallized by heat treatment in an oxidative atmosphere at a high temperature of about 600 to 800° C.

When forming a stacked type capacitor of such an oxide ferroelectric material, it is a general practice to provide a first interlayer insulating film on a MOS (Metal-Oxide Semiconductor) transistor of a select transistor or the like, laminate a lower electrode and a ferroelectric thin film in this order, process the integrated body into a desired shape by the dry etching technique, cover it with a second interlayer insulating film of an ozone TEOS film formed by CVD (Chemical Vapor Deposition) for decomposing the vapor of a liquid TEOS (Tetraethoxysilane) by ozone, open the upper portion of a capacitor and make contact with the upper electrode. Further, a third interlayer insulating film is formed on it and other interconnections are provided.

On the other hand, in order to increase the capacitance of the capacitor in correspondence with the high integration of DRAMs, oxide highly dielectric materials such as tantalum oxide ($Ta_2O_5$), strontium titanate ($SrTiO_3$), barium strontium titanate (($Ba, Sr)TiO_3$) are about to be applied to highly integrated DRAMs of a scale of 256 megabits to a scale of not smaller than gigabits in future, and they are elaborately examined. When forming a stack type capacitor with such a highly dielectric material, a method similar to that of the ferroelectric material is used.

A ferroelectric capacitor is formed by the aforementioned method, and this is followed by the lamination of platinum, titanium and titanium nitride stacked in this order as the upper electrode and the processing of the upper electrode into a drive line shape. Further, a third interlayer insulating film is formed, and it is desirable to use a CVD film (plasma TEOS film) obtained through the decomposition with TEOS by the PECVD (plasma assist CVD) as an interlayer insulating film material for it.

The above is because the ozone TEOS film, which is often used by other methods, has a significant groundwork dependency, and as shown in FIG. 2, a variation occurs in the formed film thicknesses A, B and C. Therefore, a difference in level increases, consequently making the subsequent fine processing become difficult. Furthermore, this film has a great film stress. Therefore, when the film is deposited to a thickness not smaller than a specified film thickness, the film sometimes comes to have cracks or exfoliates. The thicknesses A, C are those on metal-wirings, while the thickness B is that on a substrate.

As another generic method, there can be enumerated a thermal decomposition CVD method using silane or the like as a material. According to this method, although there remains relatively little hydrogen content after film formation, it cannot be used because it forms a film in a high-temperature reductive atmosphere exceeding the heat resistance of the ferroelectric film, lower electrode and so on.

However, the plasma TEOS film is also formed in a reductive atmosphere containing hydrogen, and the hydrogen diffuses through the upper electrode in forming the plasma TEOS film, consequently reducing the surface of the ferroelectric material that is also an oxide. Furthermore, the plasma TEOS film obtained after film formation contains a very small quantity of hydrogen, and therefore, the hydrogen separates from the plasma TEOS film and diffuses every time annealing is executed after film formation. This consequently causes a problem that the ferroelectric film is gradually reduced to disadvantageously deteriorate the ferroelectric characteristic and increase the capacitor leak current.

As a further serious problem, it is required to perform annealing in a hydrogen atmosphere for compensating for the defect in the substrate in a stage in which the device fabrication is completed. Also in this case, hydrogen is diffused in the film similar to the aforementioned case, disadvantageously deteriorating the ferroelectric film. In order to solve this problem, there has been an attempt at using an oxide electrode of $IrO_2$, $RuO_2$, $RhO_2$ or the like as an upper electrode for suppressing the influence of hydrogen.

Furthermore, a technique using an alloy of platinum and rhodium as an upper electrode is disclosed in the document of Japanese Patent Laid-Open Publication No. HEI 5-343251, and this method will be described with reference to FIG. 10.

First, an alloy film 101 of platinum and rhodium is formed by the DC sputtering method on a first silicon oxide film 102 formed on an n-type silicon substrate. Next, the alloy film 101 of platinum and rhodium is etched by the dry etching method by means of a halogen-based gas using a photoresist as a mask, and thereafter the photoresist is removed, thereby forming a lower electrode.

Next, PZT that is a ferroelectric film is formed by the RF sputtering method and thereafter etched through a photo-process similar to the lower electrode, thereby forming a dielectric film 103. Next, an alloy film of platinum and rhodium is formed by the DC sputtering method, and thereafter an alloy film of platinum and rhodium is etched by the dry etching method by means of a halogen-based gas using a photoresist as a mask similar to the formation of the lower electrode, thereby forming an upper electrode 104. Subsequently, a second silicon oxide film 106 is formed and thereafter a contact hole and an Al interconnection layer 105 are formed, thereby forming a ferroelectric memory cell having the cross-section shape shown in FIG. 10.

However, if the oxide electrode of $IrO_2$, $RuO_2$, $RhO_2$ or the like is used, there have been conversely caused the asymmetry of a hysteresis loop characteristic of the dielectric material representing a correlation between a polarization value and an application electric field as well as a deterioration such as an increase in leak current density. Furthermore, if the oxide electrode of $IrO_2$, $RuO_2$, $RhO_2$ or the like is used, the morphology of the electrode surface becomes worse, and particularly when it is used for the lower electrode, there is caused a problem that the barrier metal is oxidized to increase the leak current density.

Although the above has described the problems in the case of the ferroelectric capacitor, there has been the problem that the diffusion of hydrogen from the interlayer insulating film and the heat-treatment atmosphere occurs even in forming a capacitor employing a highly dielectric material of an oxide and the highly dielectric film is reduced by hydrogen activated with platinum served as a catalyzer, consequently lowering the dielectric constant in terms of practical effect.

Furthermore, when forming an alloy film of platinum and rhodium as an upper electrode of the ferroelectric capacitor, the characteristics of the ferroelectric film deteriorate since the alloy film of platinum and rhodium has the platinum crystallinity for allowing hydrogen to easily pass through it. Furthermore, the alloy film of platinum and rhodium is oxidized to cause a volume expansion in forming the interlayer insulating film and so on, possibility generating an exfoliation from a portion having a weak adherence.

SUMMARY OF THE INVENTION

Accordingly, the object of the present invention is to provide a semiconductor memory device capable of improving the symmetric property of the correlative hysteresis loop of the polarization value and the application voltage by devising the material of the upper electrode so as to protect the ferroelectric film from being deteriorated by activated hydrogen, thereby preventing the possible occurrence of a deterioration such as an increase in leak current density.

In order to achieve the above object, there is provided a semiconductor memory device having a ferroelectric capacitor or a highly dielectric capacitor in which a ferroelectric film or a highly dielectric film is interposed between a lower electrode and an upper electrode, the upper electrode being provided with an alloy oxide film which is comprised of platinum and rhodium and formed in a position where the upper electrode is put in direct contact with a surface of the ferroelectric film or the highly dielectric film.

According to the above construction, by forming the alloy oxide film of platinum and rhodium as the upper electrode so that it is put in direct contact with the ferroelectric film or the highly dielectric film, the plasma TEOS film can be employed as an interlayer insulating film without causing the deterioration of the ferroelectric material due to the reduction of the dielectric material by the activated hydrogen even after the formation of the capacitor employing an oxide ferroelectric material or a highly dielectric material.

According to an embodiment of the present invention, by employing the plasma TEOS film for the third interlayer insulating film, the film can be formed with a uniform thickness by the CVD method without groundwork dependency, causing no increase of stepped portions, therefore allowing the subsequent fine processing to be facilitated. Furthermore, the upper electrode prevents the diffusion of hydrogen. Accordingly, there is no need for forming a protective film for preventing the diffusion, and the difference in level can further be reduced.

According to an embodiment of the present invention, hydrogen sintering for the final recovery can be performed without deteriorating the ferroelectric characteristic nor the highly dielectric characteristic. Both the upper electrode and the ferroelectric material or the highly dielectric material are constructed of oxide materials, and therefore, the elements and oxygen atoms constituting the ferroelectric material or the highly dielectric material scarcely move even in the heat treatment in the subsequent production stage or aging during use, for which the fatigue characteristic of the ferroelectric material and the reduction with time in dielectric constant of the highly dielectric material are also improved.

The same platinum-based material is employed in the upper portion and the lower portion differently from the case where an oxide conductor of $IrO_2$, $RuO_2$, $RhO_2$ or the like is used for the upper electrode, and therefore, the asymmetry of the capacitor characteristic relevant to the direction in which the electric field is applied to the capacitor is also hard to occur.

DETAILED DESCRIPTION OF THE PREFERRED EMBODIMENTS

The present invention will be described in detail below based on the embodiments thereof with reference to the accompanying drawings.

Figure 1:
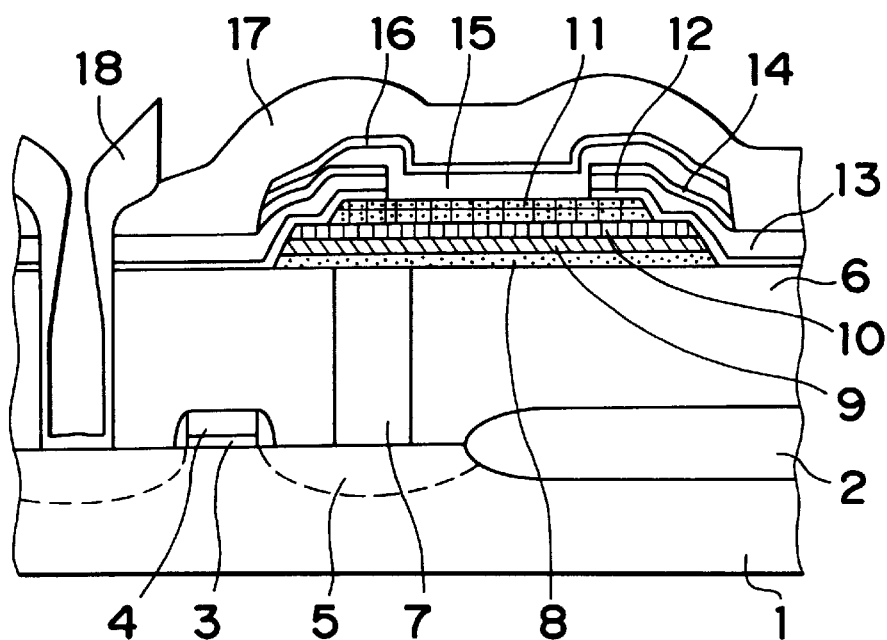
FIG. 1 is a sectional view of a semiconductor device according to one embodiment of the present invention.

Referring to FIG. 1 showing the first embodiment of the present invention, there are shown an n-type silicon substrate 1, a LOCOS (Local Oxidation of Silicon) film 2 that is formed on the surface of the n-type silicon substrate 1 and intended for element separation, a gate oxide film 3, a gate electrode 4, a source/drain region 5, a first silicon oxide film 6 formed on the silicon substrate 1 as an interlayer insulating film, a polysilicon plug 7 formed for making contact between the source/drain region 5 and a capacitor lower electrode, a titanium film 8 that is formed on the polysilicon plug 7 and intended for reducing the oxide film on the surface of the polysilicon plug 7 and improving the adherence, a titanium nitride film 9 of a diffusion barrier layer, a platinum film 10 that serves as a lower electrode, a PZT film 11 that is a ferroelectric thin film formed on the lower electrode, a titanium oxide film 12 intended for the prevention of diffusing and silicide reaction of the PZT film 11, a second silicon oxide film 13 formed as a protective film and interlayer insulating film, a titanium film 14 that serves as an adhesion layer of the second silicon oxide film 13 and the upper electrode, an upper electrode 15 that is provided by the oxide of an alloy of platinum and rhodium and formed on the PZT film 11, a titanium nitride film 16 that serves as an adhesion layer and an antireflection film, a third silicon oxide film 17 formed as an interlayer insulating film and an aluminum lead electrode 18 formed for making contact with the source/drain region 5.

The fabricating processes of the semiconductor device of the first embodiment of the present invention shown in FIG. 1 will be described below.

First, the LOCOS oxide film 2 is formed to a film thickness of about 500 Å on the surface of the silicon substrate 1, thereby forming an element separation region. Next, a select transistor constructed of the gate oxide film 3, the gate electrode 4, the source/drain region 5 and so on is formed by a known technique, and thereafter the first silicon oxide film 6 is formed to a thickness of about 5000 Å by an ozone TEOS film using the CVD (Chemical Vapor Deposition) method as an interlayer insulating film. Then a contact hole having a diameter of 0.5 µm is formed by the photolithographic technique and the dry etching technique.

Subsequently, polysilicon is buried in the contact hole by the CVD method, and thereafter the surface is flattened by the CMP (Chemical Mechanical Polishing) method with phosphorus diffused in the polysilicon, thereby forming the polysilicon plug 7. The titanium film 8 was formed to a film thickness of 300 Å on this polysilicon plug 7 by the DC magnetron sputtering method as a barrier metal for suppressing the silicide reaction of the polysilicon with the platinum of the lower electrode, and the titanium nitride film 9 was further formed to a film thickness of 2000 Å by the DC magnetron reactive sputtering method. The platinum film 10 was formed to a film thickness of 1000 Å as a lower electrode on this barrier metal by the DC magnetron sputtering method.

Further, in order to improve the adherence of the formed lower electrode, annealing was effected for 30 minutes in nitrogen at a temperature of 600° C. in an electric furnace.

Subsequently, the PZT film 11 was formed to a film thickness of 2000 Å by the sol-gel method. The above PZT film forming method is performed by firstly dissolving lead acetate, titanium isopropoxide and zirconium isopropoxide into a solvent of 2-methoxyethanol so that the ratio of Pb:Ti:Zr=100:52:48 thereby forming a sol-gel material solution, coating this material solution on a silicon wafer formed to the lower electrode by means of a spinner rotating at a rotating speed of 3000 rpm, drying the wafer at a temperature of 150° C. for 10 minutes in the atmospheric air and thereafter performing temporary baking at a temperature of 400° C. for 30 minutes in the atmospheric air. The coating is repeated three to five times so that the desired film thickness of 2000 Å is achieved. Subsequently, a heat treatment for crystallization is performed by the RTA (Rapid Thermal Annealing) method at a temperature of 650° C. for 30 seconds in an atmosphere of a mixture of nitrogen and oxygen. In this stage, the flow rates of nitrogen and oxygen were set so that nitrogen flow rate: oxygen flow rate=4:1.

Next, the PZT film 11 and the lower electrode 10 were processed to a size of, for example, about 2.6 µm×2.6 µm and 3.0 µm×3.0 µm by the dry etching method, respectively. Subsequently, the titanium oxide film 12 was formed by the RF magnetron reactive sputtering method to a thickness of 250 Å as a diffusion preventing layer of the elements constituting the ferroelectric capacitor. The ozone TEOS film 13 was formed as a second interlayer insulating film by the CVD method, and the titanium film 14 was further formed by the RF magnetron sputtering method to a thickness of 300 Å as a layer for adhesion to the upper electrode of the capacitor to be formed on it. Next, a hole of, for example, about 1.8 µm×1.8 µm was formed by the dry etching method through the titanium film 14, the second interlayer insulating film 13 and the titanium oxide film 12 above the ferroelectric capacitor, so that a contact hole was opened up to the surface of the PZT film 11. The PZT film 11 was damaged by plasma exposure due to the dry etching. In order to recover this, a heat treatment was performed at a temperature of 500° C. for 30 seconds in oxygen by the RTA (Rapid Thermal Annealing) method.

Next, the alloy oxide film 15 of platinum (Pt) and rhodium (Rh) was formed by the DC magnetron reactive sputtering method to a thickness of 1000 Å as the upper electrode of the ferroelectric capacitor.

The elemental composition ratio of the formed alloy oxide film 15 of platinum and rhodium was expressed by the ratio of platinum: rhodium oxygen=70:15:15. The film formation was performed by the RF magnetron reactive sputtering method while adjusting the total gas flow rate so that the reaction chamber comes to have a pressure of 10 mTorr at a gas flow rate of argon:oxygen=2:1. If the rhodium content increases with respect to the composition ratio of platinum to rhodium, then the crystallinity of platinum having a peak of (111) becomes worse, and this is disadvantageous because a volumetric expansion will be significant during heat treatment in the subsequent process. Therefore, the rhodium content must be not greater than 20 percent in terms of the composition ratio thereof to platinum. Furthermore, unless a rhodium content of not smaller than 10 percent is achieved, no sufficient oxide results, so that the effect of platinum atoms for activating hydrogen cannot be suppressed. Therefore, rhodium must be not smaller than 10 percent and not greater than 20 percent in terms of the composition ratio thereof to platinum. Furthermore, for the same reason as above, the oxygen content relative to all the elements must be not smaller than 10 percent and not greater than 17 percent.

Next, the titanium nitride film 16 was formed by the RF magnetron reactive sputtering method to a film thickness of 250 Å on the alloy oxide of platinum and rhodium. This film improves the adherence thereof to the third interlayer insulating film and operates as an antireflection film in the photolithography process.

Next, the titanium nitride film 16, the alloy oxide film 15 of platinum and rhodium and the titanium film 14 were processed into a drive line shape by the dry etching method using chlorine gas. As stated before, the PZT film is also indirectly damaged by plasma exposure due to this dry etching. Therefore, for the purpose of recovering this, a heat treatment was performed at a temperature of 550° C. for 30 seconds in oxygen by the RTA method.

Figure 2:
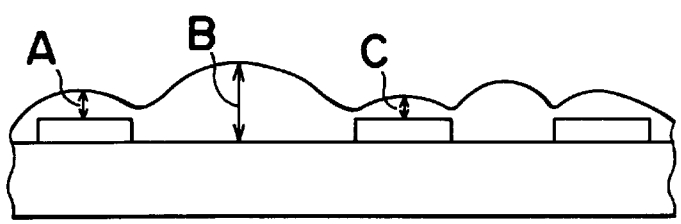
FIG. 2 is a sectional view of an ozone TEOS film formed on metal stepped portions under general conditions.
Figure 3:
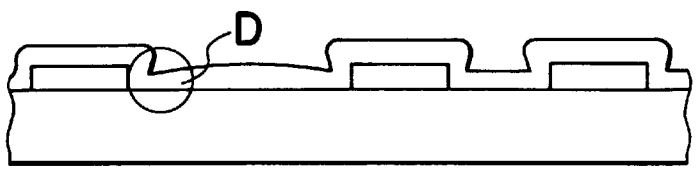
FIG. 3 is a sectional view of a plasma TEOS film formed on metal stepped portions under general conditions.

Next, using a material of TEOS (tetraethoxysilane), the third interlayer insulating film 17 comprised of a plasma TEOS film of 3000 Å, an ozone TEOS film of 7000 Å and a plasma TEOS film of 3000 Å was formed. In general, the plasma TEOS film has a small moisture content in the film, however, it has a great amount of hydrogen content. The plasma TEOS film also tends to have a shape as indicated by the reference character D in FIG. 3, when its thickness is increased. The reference character D indicates a part near an end of a metal wiring where the shape of a deposited interlayer film becomes overhangingly. On the other hand, the ozone TEOS film has a small amount of hydrogen content in the film, however, it has a great amount of moisture and a groundwork dependency. Consequently, the film thickness of the interlayer insulating film varies as shown in FIG. 2, and it tends to have a shape of varied contact depths (indicated by the reference characters Å through C in FIG. 2). This may cause a problem that the contact hole will not be opened.

Figure 4:
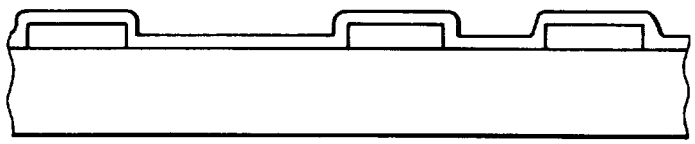
FIG. 4 is a sectional view of the plasma TEOS film of FIG. 3 improved in shape by argon sputtering.

In view of the above, the plasma TEOS film was firstly formed to a thickness of 3000 Å as the third interlayer insulating film. Since an overhung shape (see the reference character D in FIG. 3) appeared even at this degree of film thickness, the shape was improved as shown in FIG. 4 by reverse sputtering using argon, and thereafter the ozone TEOS film was formed to a thickness of 7000 Å. This film contained a certain amount of moisture, and therefore, the plasma TEOS film was formed to a thickness of 3000 Å for the prevention of the upward diffusion of moisture. The contact hole was formed in this place and the aluminum lead electrode 18 extending from the source/drain region was formed by the DC magnetron sputtering method.

Figure 5:
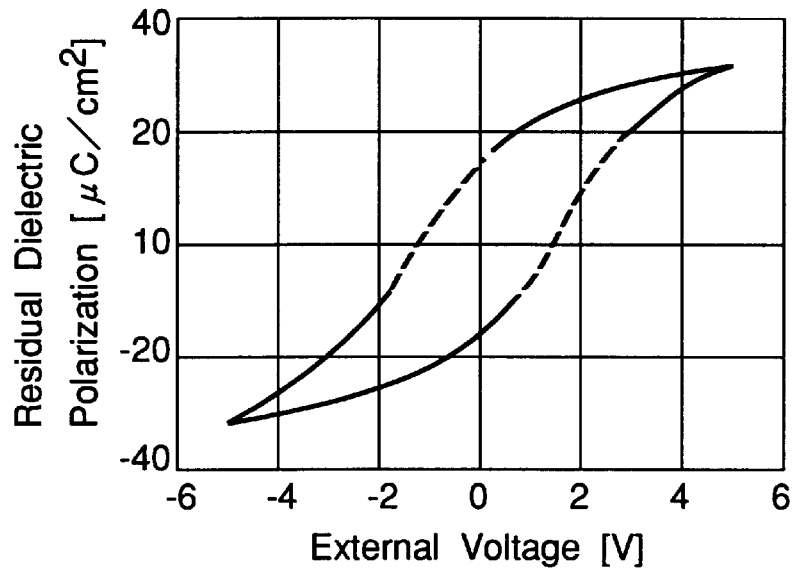
FIG. 5 is a graph showing a hysteresis loop representing the characteristic of a ferroelectric capacitor formed in accordance with the first embodiment of the present invention.

By applying a triangular electric signal across the upper electrode comprised of the alloy oxide film of platinum and rhodium of the capacitor having the ferroelectric film formed through the aforementioned processes and the aluminum lead electrode extending from the silicon substrate, a hysteresis loop as shown in FIG. 5 was obtained. This applied triangular electric signal had a voltage of 5 V and a frequency of 75 Hz. As shown in FIG. 5, a saturation polarization value was 29.2 $\mu C/cm^2$ and the residual dielectric polarization value was 15.6 $\mu C/cm^2$ at the voltage of 5 V, so that a high dielectric property sufficient for use as a ferroelectric capacitor was obtained. Furthermore, the symmetry of the hysteresis loop is scarcely collapsed, indicating that a sufficient contact is made between the upper electrode and the silicon substrate.

Figure 6:
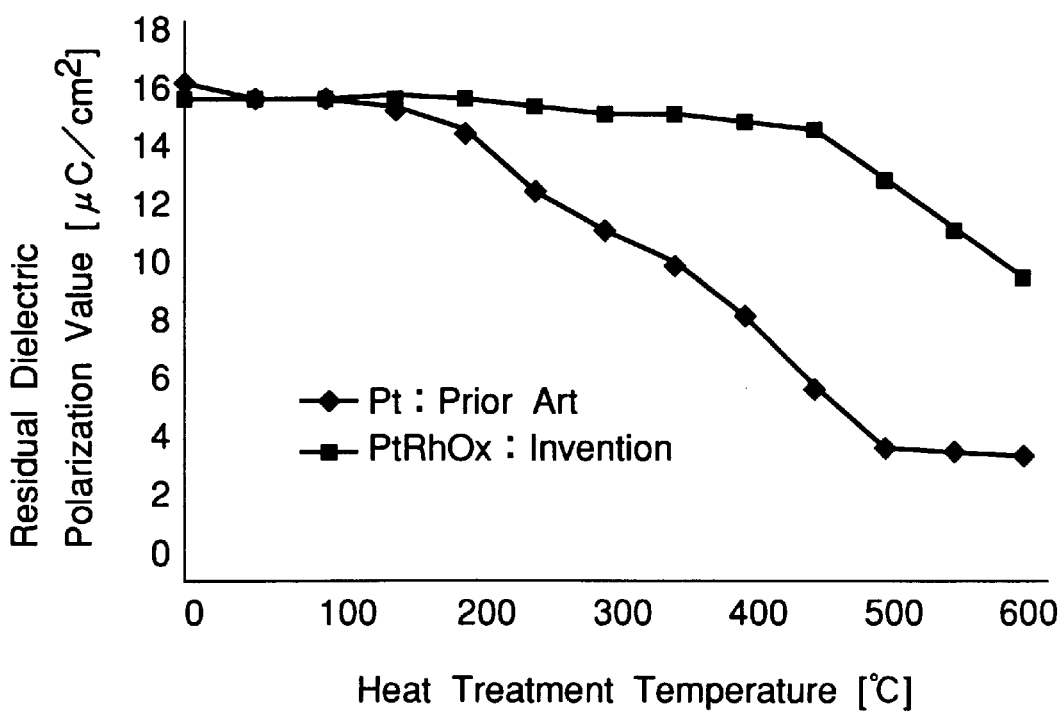
FIG. 6 is a graph showing a relation between the residual dielectric polarization value and the heat treatment temperature of a capacitor in the case where platinum is used for the upper electrode and that in the case where an alloy oxide film of platinum and rhodium is used for the upper electrode.

Furthermore, a similar capacitor was formed of platinum for the capacitor upper electrode by the prior art technique, and the capacitor to which the present invention is applied and the prior art capacitor were concurrently subjected to a heat treatment for 10 minutes in an atmosphere of five percent of hydrogen and 95 percent of nitrogen while changing the heat treatment temperature, and the residual dielectric polarization values were measured after the heat treatment. As shown in FIG. 6, it was discovered that the residual dielectric polarization value of the capacitor using the prior art technique was reduced at and around the temperature of 180° C. and the residual dielectric polarization value of the capacitor of the present invention was not reduced until the temperature of 430° C.

Figure 7:
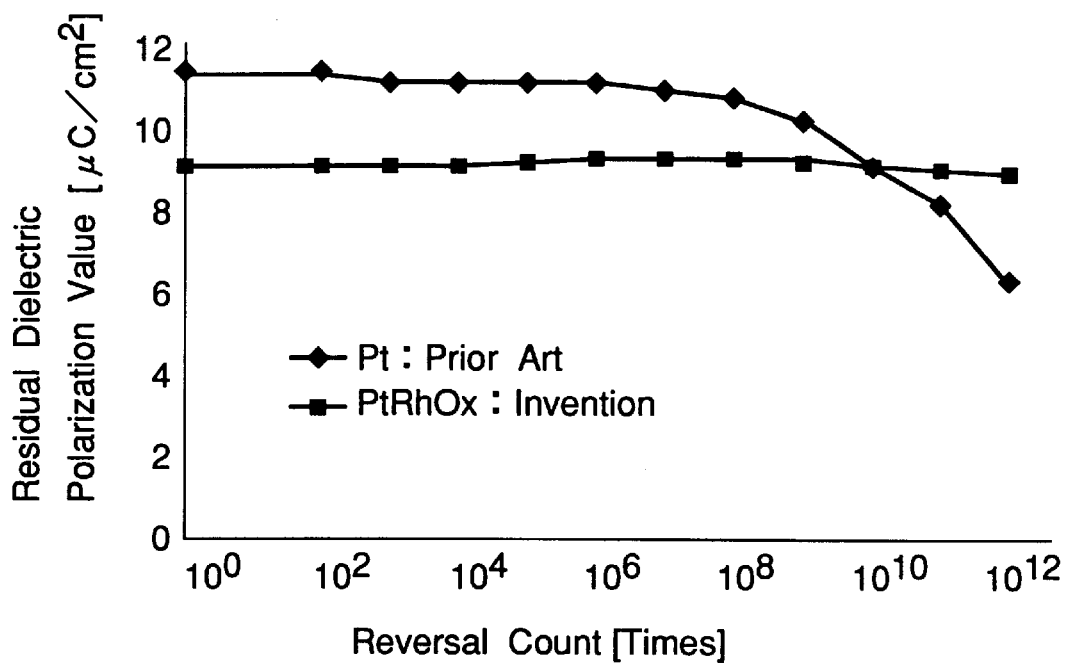
FIG. 7 is a graph showing a relation between the residual dielectric polarization value of a capacitor and the number of applied pulses in the case where platinum is used for the upper electrode and that in the case where an alloy oxide film of platinum and rhodium is used for the upper electrode.

On the other hand, it has been known that the ferroelectric material has a fatigue represented by the phenomenon that the polarization value reduces when reversal polarization is repeated. When a rectangular electric signal of 1 MHz and 5 Vpp is applied to the capacitor, the residual dielectric polarization value obtained after repeating reversal polarization not less than $10^9$ times is suddenly reduced as shown in FIG. 7 in the prior art structure in which platinum is used for the upper electrode. In contrast to this, it was discovered that the number of reversal times as a consequence of which the reduction in polarization value accompanied by reversal polarization significantly increased and no fatigue occurred until reversal polarization reversal were repeated not less than $10^{12}$ times by using the present invention.

Although the sol-gel method is used as the film forming method of the ferroelectric film in the present embodiment, it is acceptable to use the MOCVD method, the vacuum deposition method, the magnetron reactive sputtering method, the MOD method or another method. Although the PZT film is used as the ferroelectric film in the present embodiment, a similar structure can also be used in $PbTiO_3$, $(Pb_xLa_{1-x})TiO_3$, $(Pb_xLa_{1-x})(Zr_yTi_{1-y})O_3$, $Bi_4Ti_3O_{12}$, $BaTiO_3LiNbO_3$, $LiTaO_3$, $SrBi_2Ta_2O_9$, $YMnO_3$, $Sr_2Nb_2O_7$, $SrBi_2(Ta_xNb_{1-x})_2O_9$ or the like or a highly dielectric material of $(Ba_xSr_{1-x})TiO_3$, $SrBi_4Ti_4O_{15}$ or the like.

Figure 8:
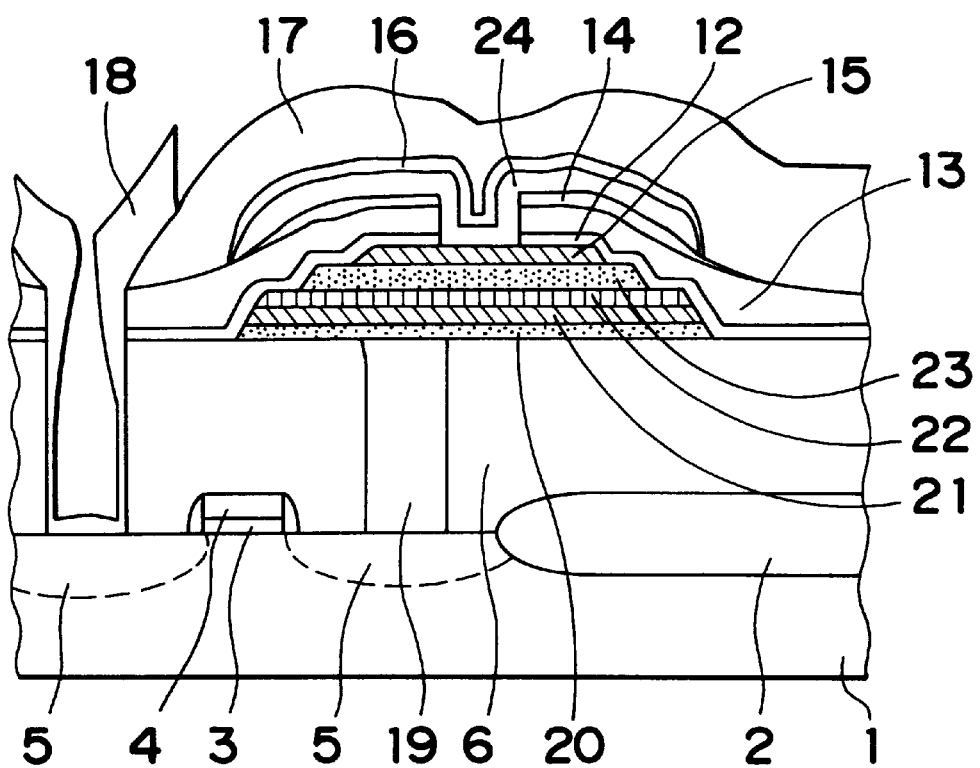
FIG. 8 is a sectional view of a semiconductor device according to a second embodiment of the present invention.

FIG. 8 shows the second embodiment of the present invention, where the same components described with reference to FIG. 1 are denoted by the reference numerals and no description is provided for them. In FIG. 8 are shown a tungsten plug 19 formed for making contact of the source/drain region 5 with the capacitor lower electrode, an alloy film 20 of platinum and rhodium formed on the tungsten plug, an alloy oxide film 21 of platinum and rhodium formed as a diffusion barrier and oxygen preventing film, a platinum film 22 for improving the morphology of the ferroelectric film, and a titanium oxide film 12 that serves as a diffusion preventing layer of elements of the ferroelectric film 23 formed on the lower electrode 22. In FIG. 8 are also shown a $SrBi_2Ta_2O_9$ (SBT) film 23 formed on the lower electrode 22 and an alloy film 24 of platinum or platinum and rhodium for a drive line interconnection.

The fabricating process of the semiconductor device of the second embodiment of the present invention shown in FIG. 8 will be described below.

First, the LOCOS oxide film 2 is formed to a film thickness of about 500 Å on the surface of the silicon substrate 1, thereby forming an element separation region. Next, a select transistor constructed of the gate oxide film 3, the gate electrode 4, the source/drain region 5 and so on is formed by a known technique, and thereafter the first silicon oxide film 6 is formed to a thickness of about 5000 Å by an ozone TEOS film using the CVD (Chemical Vapor Deposition) method as an interlayer insulating film. Then a contact hole having a diameter of 0.5 $\mu m$ is formed by the photolithographic technique and the dry etching technique.

Subsequently, tungsten is buried in the contact hole by the CVD method, and thereafter the surface is flattened by the CMP (Chemical Mechanical Polishing) method, thereby forming the tungsten plug 19. The alloy film 20 of platinum and rhodium was formed to a film thickness of 700 Å on this tungsten plug 19 by the DC magnetron sputtering method, thereafter alloy oxide film 21 of platinum and rhodium to a film thickness of 300 Å on the alloy film 20 by the DC magnetron reactive spattering method, and the platinum film 22 was further formed to a film thickness of 500 Å by the DC magnetron sputtering method. The elemental composition ratio of the formed alloy film of platinum and rhodium was expressed by the ratio of platinum:rhodium=80:20. The elemental composition ratio of the alloy oxide film of platinum and rhodium was expressed by the ratio of platinum:rhodium:oxigen=70:15:15. The film formation was performed by the magnetron reactive sputtering method while adjusting the total gas flow rate so that the reaction chamber come to have a pressure of 10 mTorr at a gas flow rate of argon:oxygen=2:1.

Next, a material solution of $SrBi_2Ta_2O_9$ (SBT) was coated on this lower electrode by a spinner rotating at a rotating speed of 3000 rpm by the MOD (Metal Organic Deposition) method and dried at a temperature of 250° C. for five minutes. First baking was performed at a temperature of 600° C. for five minutes in an oxygen atmosphere at the atmospheric pressure, and subsequently second baking, i.e. a heat treatment for crystallization, was performed in an oxygen atmosphere at a temperature of 800° C. for five minutes by the RTA method. The processes from the coating to the heat treatment for crystallization were repeated three to five times so that an SBT film 23 came to have the desired film thickness of 2000 Å. The forming method may be the sputtering method or the MOCVD (Metal Organic CVD) method besides the MOD method. In this case, when the composition ratio of rhodium increases in the alloy film of platinum and rhodium, the crystallinity of platinum having a peak of (111) and the film flatness become worse, so that the leak current characteristic of the ferroelectric film that lies in the upper layer deteriorates. Therefore, rhodium must have an element ratio of not greater than 80 percent relative to platinum. If the rhodium content is small in the alloy oxide film of platinum and rhodium, no sufficient oxide film results to reduce the oxygen blocking effect, so that the surface of the tungsten plug is oxidized during annealing in the presence of oxygen, consequently causing an electrical defective continuity. Therefore, rhodium must have an element ratio of not smaller than 10 percent relative to platinum in the alloy oxide film of platinum and rhodium.

Next, the alloy oxide film 15 of platinum and rhodium was formed by the DC magnetron reactive sputtering method to a thickness of 1000 Å as the upper electrode of the ferroelectric capacitor on the SBT film. Next, patterning was performed using a photoresist by the photolithographic technique, and the alloy oxide film of platinum and rhodium and the SBT film were processed by the dry etching method to a size of, for example, about 2.7 μm×2.7 μm and 3.0 μm×3.0 μm, respectively. Subsequently, the titanium oxide film 12 was formed by the RF magnetron reactive sputtering method to a thickness of 250 Å as a diffusion preventing layer of the elements constituting the ferroelectric capacitor. The ozone TEOS film 13 was formed as a second interlayer insulating film by the CVD method, and the titanium film 14 was further formed by the RF magnetron sputtering method to a thickness of 300 Å as a layer for adhesion to a drive line interconnection 24 to be formed on it.

Next, a hole of, for example, about 0.8 μm×0.8 μm was formed by the dry etching method through the titanium film 14, the second interlayer insulating film 13 and the titanium oxide film 12 above the ferroelectric capacitor, so that a contact hole was opened up to the alloy oxide film 15 of platinum and rhodium as the upper electrode.

Next, an alloy film 24 of platinum and rhodium was formed to a thickness of 1000 Å by the DC magnetron sputtering method. In this case, platinum may be used in place of the alloy film of platinum and rhodium. The PtRh or Pt is further employed on the upper electrode $PtRhO_x$ as a drive line, and because of the presence of a subsequent heat treatment at a temperature of 800° C., the alloy film of platinum and rhodium or a platinum film having an endurance to high temperature is used. In terms of cost, the alloy film of platinum and rhodium has an advantage that it can be formed with an identical sputtering target by an apparatus for forming the alloy oxide film of platinum and rhodium. However, it has a wiring resistance slightly higher than that of platinum, and therefore, it can be considered to use platinum according to circumstances.

Next, a titanium nitride film 16 was formed by the RF magnetron reactive sputtering method to a film thickness of 250 Å on platinum or the alloy film of platinum and rhodium. This film improves the adherence thereof to the third interlayer insulating film and operates as an antireflection film in the next photolithography process. Next, patterning into a drive line interconnection shape was performed using a photoresist by the photolithographic technique.

Next, the titanium nitride film 16 and the film 24 that is alloy film of platinum and rhodium or platinum, and the titanium 14 were processed into a drive line shape by the dry etching method using chlorine gas. The SBT film is also indirectly damaged by plasma exposure due to this dry etching. Therefore, for the purpose of recovering this and improving the leak characteristic of the ferroelectric capacitor, a heat treatment was performed in an oxygen atmosphere at a temperature of 800° C. for 15 minutes.

Next, using a material of TEOS (tetraethoxysilane), the third interlayer insulating film 17 comprised of a plasma TEOS film of 3000 Å, an ozone TEOS film of 7000 Å and a plasma TEOS film of 3000 Å was formed. In general, the plasma TEOS film has a small moisture content in the film, however, it has a great amount of hydrogen content. The plasma TEOS film also tends to have a shape as indicated by the reference character D in FIG. 3, when its thickness is increased. On the other hand, the ozone TEOS film has a small amount of hydrogen content in the film, however, it has a great amount of moisture and a groundwork dependency. Consequently, the film thickness of the interlayer insulating film varies as shown in FIG. 2. In view of the above, the plasma TEOS film was firstly formed to a thickness of 3000 Å as the third interlayer insulating film. Since an overhung shape (see the reference character D in FIG. 3) appeared even at this degree of film thickness, the shape was improved as shown in FIG. 4 by reverse sputtering using argon, and thereafter the ozone TEOS film was formed to a thickness of 7000 Å. This film contained an increased amount of moisture, and therefore, the plasma TEOS film was formed to a thickness of 3000 Å for the prevention of the upward diffusion of moisture. The contact hole was formed in this place and the aluminum lead electrode 18 extending from the source/drain region 5 was formed by the DC magnetron sputtering method.

Figure 9:
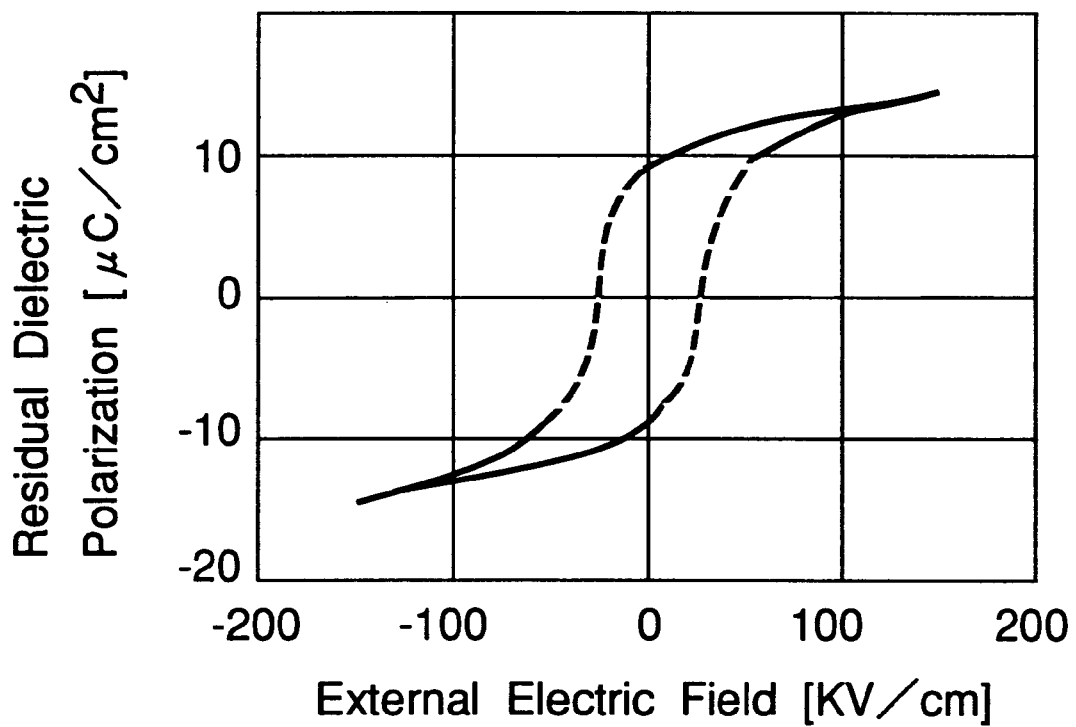
FIG. 9 is a graph showing a hysteresis loop representing the characteristic of a ferroelectric capacitor formed in accordance with the second embodiment of the present invention.
Figure 10:
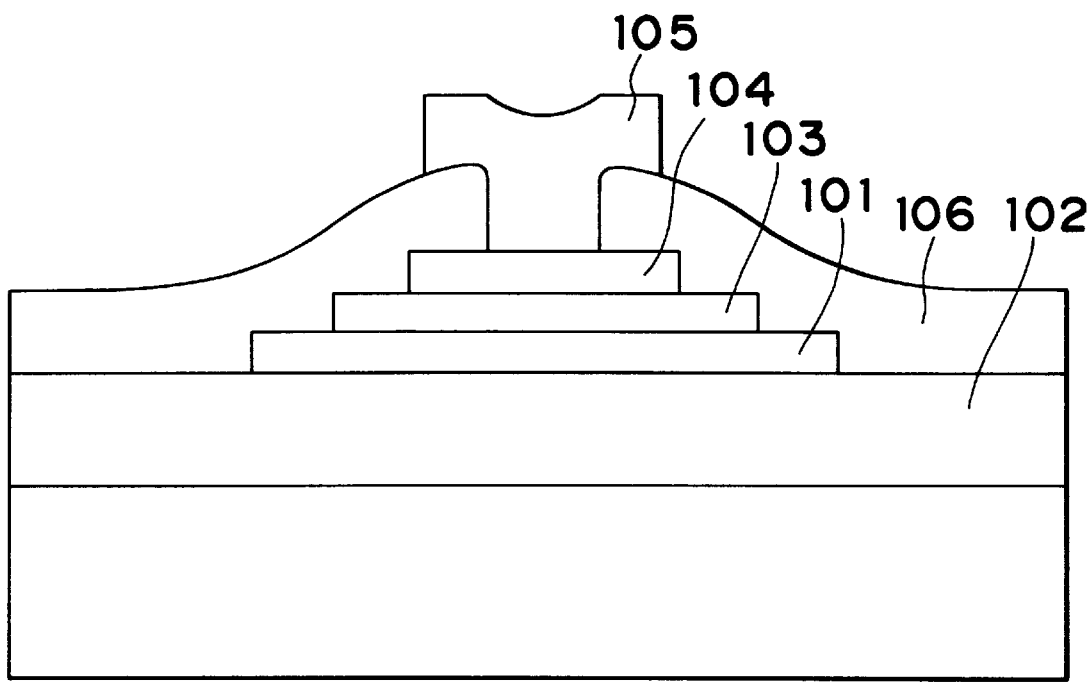
FIG. 10 is a diagram for explaining a prior art.

By applying a triangular electric signal across the upper electrode comprised of the alloy oxide film of platinum and rhodium of the capacitor having the ferroelectric film formed through the aforementioned processes and the aluminum lead electrode extending from the silicon substrate, a hysteresis loop as shown in FIG. 9 was obtained. This applied triangular electric signal had a voltage of 3 V and a frequency of 75 Hz. As shown in FIG. 9, a saturation polarization value was 14.3 $\mu C/cm^2$ and the residual dielectric polarization value was 9.0 $\mu C/cm^2$ at the voltage of 3 V, so that a high dielectric property sufficient for use as a ferroelectric capacitor was obtained. Furthermore, the symmetry of the hysteresis loop is scarcely collapsed, indicating that a sufficient contact is made between the upper electrode and the silicon substrate.

It was discovered that the fatigue by repetitive reversal polarization typical of ferroelectric materials is improved considerably in a similar way to the first embodiment.

Although the MOD method is used as the film forming method of the ferroelectric film in the present embodiment, it is acceptable to use the MOCVD method, the vacuum deposition method, the magnetron reactive sputtering method, the sol-gel method or another method. Although the SBT film is used as the ferroelectric film in the present embodiment, a similar structure can also be used in PZT, $PbTiO_3$, $(Pb_xLa_{1-x})TiO_3$, $(Pb_xLa_{1-x})(Zr_yTi_{1-y})O_3$, $Bi_4Ti_3O_{12}$, $BaTiO_3$, $LiNbO_3$, $LiTaO_3$, $YMnO_3$, $Sr_2Nb_2O_7$, $SrBi_2(Ta_xNb_{1-x})_2O_9$ or the like or a highly dielectric material of $(Ba_xSr_{1-x})TiO_3$, $SrBi_4Ti_4O_{15}$ or the like.

Although the combination of the plasma TEOS film and the ozone TEOS film was employed as the third interlayer insulating film in the first and second embodiments, it is allowed to employ, besides them, an interlayer insulating film having a single layer or a laminate structure of combined layers of a silicon oxide film or a plasma SiN film obtained by the CVD method using ECR the material of which is silane similarly containing hydrogen or using helicon plasma, an SOG film or an SiOF film of organic materials and the like.

What is claimed is:

1. A semiconductor device having a ferroelectric or highly dielectric capacitor in which a ferroelectric or highly dielectric film is interposed between a lower electrode and an upper electrode, the lower electrode including an alloy film of platinum and rhodium, an alloy oxide film of platinum and rhodium formed on the alloy film, and a platinum film formed on the alloy oxide film, the upper electrode including an alloy oxide film comprising platinum and rhodium that is formed in direct contact with a surface of the ferroelectric or highly dielectric film, and a rhodium content relative to the sum total of the platinum and rhodium in the alloy oxide film of platinum and rhodium of the upper electrode being not smaller than 10 percent and not greater than 20 percent.

2. A semiconductor device as claimed in claim 1, wherein said lower electrode is electrically connected to a conductive plug that contacts a source/drain region of a transistor.

3. A semiconductor device as claimed in claim 2, wherein said conductive plug comprises tungsten.

* * * * *